April 3, 1973 K. E. BEAN ET AL 3,725,160

HIGH DENSITY INTEGRATED CIRCUITS

Filed Dec. 30, 1970

INVENTORS
Kenneth E. Bean
Richard L. Yeakley

United States Patent Office 3,725,160

Patented Apr. 3, 1973

3,725,160

HIGH DENSITY INTEGRATED CIRCUITS

Kenneth E. Bean, Richardson, and Richard L. Yeakley, Dallas, Tex., assignors to Texas Instruments Incorporated, Dallas, Tex.

Filed Dec. 30, 1970, Ser. No. 102,585

Int. Cl. H01l 7/00

U.S. Cl. 156—17 10 Claims

ABSTRACT OF THE DISCLOSURE

Monocrystalline silicon and other cubic crystals are preferentially etched to provide grooves having symmetrical sidewalls sloped at angles of 72.45° or 46.51°. A {100} surface of the crystal is selectively masked to provide apertures aligned with an intersection of a {113} plane located in a <310> direction, or a {331} plane located in a <310> direction. The etched semiconductor crystal is used to fabricate integrated circuits having increased component packing density and/or optimized isolation moat angles for lead metallization.

This invention relates to the preferential etching of semiconductor crystals, and more particularly to the fabrication of semiconductor structures wherein preferred crystallographic, orientation-dependent etching is employed to provide improved control of etched profiles, thus providing enhanced device packing density and/or novel isolation techniques.

Selective etching of silicon, germanium and other semiconductor crystals may be practiced in the fabrication of semiconductor devices and integrated circuits, and it is known that improved control of etched profiles can be achieved by the use of anisotropic etching techniques. For example, in the fabrication of dielectrically isolated integrated circuits anisotropic etching is employed to provide electrical isolation between device components. The usual practice is to etch rectangular patterns in a {100} surface of a silicon wafer, using an oxide mask patterned to provide apertures aligned wiht the intersection of a {111} plane. However, even when using an orientation-dependent etchant in order to control etched profiles, severe undercutting occurs with {111} mask alignment, particularly at the corners of the rectangular pattern. The corners of the resulting silicon islands are severely undercut and faceted. This problem frequently causes device fabrication failure due to subsequent mask alignment problems, such as during base diffusions or collector contact diffusions.

In order to compensate for the tendency to obtain "rounded" corners, a substantial effort has been directed to the design of mask patterns having "compensated" corners, whereby a square corner can sometimes be achieved despite the severe undercutting problem. The use of such modified mask patterns has not been completely satisfactory, particularly since additional space is consumed on the surface of a slice, thereby limiting the component packing density.

Accordingly, it is an object of the present invention to provide an improved technique for the anisotropic etching of cubic semiconductor crystals. It is a further object of the invention to provide an anisotropic etching technique capable of producing symmetrical etched profiles having selected sidewall angles. Still further, it is an object of the invention to provide an anisotropic etching technique capable of achieving rectangular etched patterns having square corners, without the need for masks having corner compensations.

One aspect of the invention is embodied in a method for the selective preferential etching of a cubic semiconductor crystal surface having {100} crystallographic orientation. An etch-resistant mask is formed on said surface and patterned to provide an aperture therein aligned with the intersection of said {100} surface with a {331} plane located in a <310> direction. The masked surface is then contacted with an orientation-dependent etchant for a time sufficient to achieve the desired profile.

A second aspect of the invention is also embodied in a method for the selective preferential etching of a cubic semiconductor crystal surface having a {100} orientation. In this instance, an etch-resistant mask is formed and patterned on said surface to provide an aperture therein aligned with the intersection of said {100} surface with a {113} plane located in a <310> direction. As before, the masked crystal surface is then contacted with an orientation-dependent etchant for a time sufficient to achieve the desired etched profile.

The invention is particularly applicable to the preferential etching of monocrystalline silicon. However, it will be apparent that the invention is also applicable to the preferential etching of other crystals having a cubic crystal lattice, including germanium, for example.

Techniques for providing a semiconductor slice having a {100} crystallographic orientation are well-known and need not be specifically described for purposes of the present disclosure.

In the processing of silicon slices, the most common etch-resistant mask is a layer of thermally-grown silicon oxide. Alternatively, a suitable oxide layer is deposited by chemical vapor techniques such as the oxidation of silane vapors. A silicon nitride mask is also useful, and may be deposited by the reaction of $SiH_4$ and $NH_3$. Such techniques for forming etch-resistant mask layers are also well-known and need not be particularly described for purposes of the present disclosure.

The use of photolithographic technique to pattern an etch-resistant mask layer on semiconductor slices is well known and need not be particularly described for purposes of the present disclosure.

The essence of the present invention lies primarily in the orientation of the aperture pattern provided in the etch-resistant mask. The invention is based in part on the discovery that {331} planes and {113} planes are "slow" etch planes relative to the {100} planes. This discovery, by itself, does not fully account for the square corners achieved, since the {111} planes are slow etch planes, too. An additional feature of the invention lies in the double four-fold symmetry of the {331} planes and of the {113} planes with respect to the {100} planes. Such symmetry permits all sides of a rectangular mask pattern to be aligned with an appropriate {331} or {113} plane, and in addition, assures a high resistance to undercutting at the corners, since the corners also lie, approximately, in a {331} plane or {113} plane, respectively. Thus, anisotropic etching with use of a mask oriented in accordance with the invention not only produces an etch profile determined by the slope of the plane along whose intersection the mask aperture pattern is aligned, but also provides square corner etching, without mask compensations.

Various orientation dependent etch solutions are known. The most commonly employed is a tertiary mixture of potassium hydroxide, n-propanol, and water. Other solutions include the hydrazine-water system and the pyrocatecholhydrazine system. Any of these solutions is useful in the practice of the present invention, in addition to other known preferential etchants.

Figure 1:
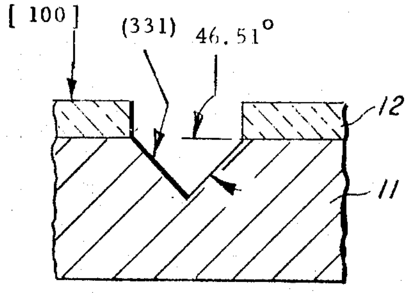
FIG. 1 is an enlarged cross-section of a silicon wafer, illustrating an etched profile resulting from anisotropic etching in a <100> direction through an aperture aligned with the intersection of a {331} plane.

As shown in FIG. 1, the surface of silicon wafer 11 is crystallographically oriented in a {100} plane. The wafer is subjected to thermal oxidation at a temperature of 1100° C. for 60 minutes to form oxide layer 12 having a thickness of 7000 angstroms. Using known photolithographic techniques, layer 12 is patterned to provide a rectangular aperture having the required opening width to give the desired etch depth. This pattern has all sides oriented along the intersection of {331} planes located in a <310> direction. The wafer is then immersed in an orientation-dependent etch solution consisting of potassium hydroxide, n-propanol and water in the weight ratio 5:4:16 at a temperature of about 85° C. for 25 minutes whereby the illustrated profile results due to termination of the etch on the {331} planes, which intercept the wafer surface at an angle of 46.51°. The average etch rate in a <100> direction under these conditions is approximately 0.8 microns per minute.

Figure 2:
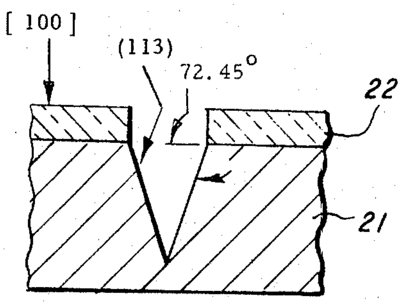
FIG. 2 is an enlarged cross-section of a silicon wafer, illustrating anisotropic etching in a <100> direction through an aperture aligned with the intersection of a {113} plane.

As shown in FIG. 2, silicon wafer 21 has a surface oriented in a {100} plane. In the same manner as before, wafer 21 is provided with a masking layer 22. As before, known photolithographic techniques are employed to open rectangular apertures in layer 22, the sides of such are oriented along the intersection of a {113} plane with the wafer surface. Then the wafer is immersed in a KOH propanol water system under similar conditions as before with the {113} planes providing etch termination surfaces at the sharper angle of 72.45°.

Figure 3:
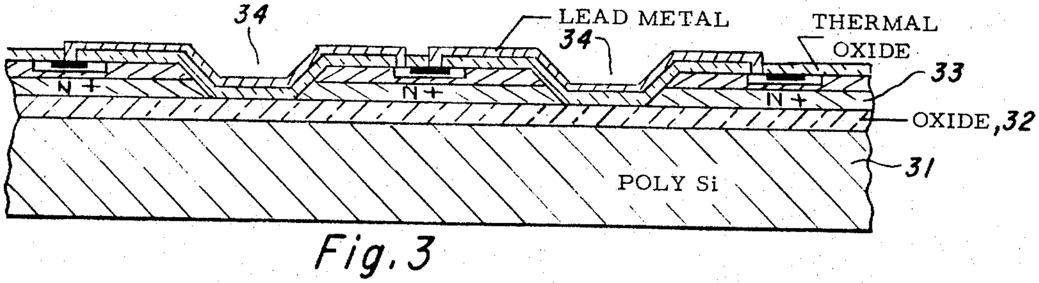
FIG. 3 is an enlarged cross-section of an integrated circuit, the fabrication of which utilizes the etching technique of the present invention.

As shown in FIG. 3, a three-layer structure is initially provided consisting of polysilicon 31, silicon oxide 32, and single crystal silicon layer 33. Then, using the etch technique illustrated in FIG. 1, moats 34 are etched down to the oxide layer thereby isolating the monocrystalline islands. The subsequent fabrication of components, followed by thermal oxidation and metallization are completed in accordance with known techniques. The primary benefit illustrated is the ability to achieve substantially greater yields from the metallization step due to the absence of sharp angles formed at the upper and lower edges, respectively, of the silicon islands. That is, in the prior practice steeper angles have resulted in metallization failures.

Figure 4:
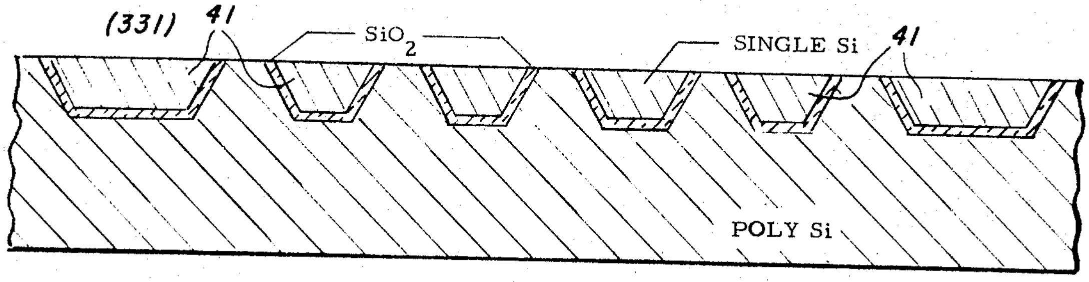
FIG. 4 is an enlarged cross-section of an alternate semiconductor structure fabricated in accordance with one aspect of the invention.

As shown in FIG. 4, the etched angles provided by the technique of the present invention are effectively utilized to produce dielectrically isolated monocrystalline islands 41 having increased packing density because of the steeper angles achieved with {113} termination planes, as illustrated in FIG. 2, and because of sharper corners obtained with both the {113} and the {331} termination planes, without mask corner compensation.

Figure 5:
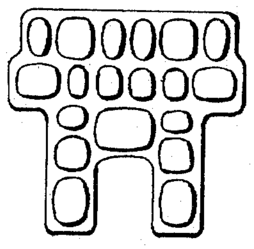
FIG. 5 is an enlarged plan view of a silicon wafer etched in a <100> direction through apertures aligned with the intersection of a {111} plane.
Figure 6:
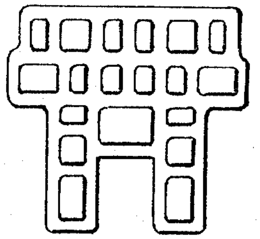
FIG. 6 is an enlarged plan view of a silicon wafer etched in a <100> direction through apertures aligned with a {331} plane located in a <310> direction.

FIGS. 5 and 6 present a comparison of the prior art with the present invention, respectively, showing in FIG. 5, island corners becoming severaly "rounded" when the mask patterns are aligned with an intersection of a {111} plane. As shown in FIG. 6, mask alignment with a {331} plane located in a <310> direction permits rectangular patterns to be etched with essentially no rounding at the corners, even without "corner compensation" in the masks.

In defining the invention, the mask aperture orientation has been specified as "aligned with" the intersection of a {331} plane or a {113} plane. Those skilled in the art will recognize, however, that some misalignment can be tolerated without sacrificing the benefits and advantages of the invention. Accordingly, the following claims are to be interpreted as including a reasonable amount of misalignment.

What is claimed is:

1. A method for the selective, preferential etching of a cubic semiconductor crystal having {100} surface orientation comprising:
- forming an etch-resistant mask layer on said surface;
- patterning said mask layer to provide an aperture therein having at least one side aligned with the intersection of said surface with a {331} plane located in a <310> direction; and
- subjecting the masked surface to an orientation-dependent etchant.

2. A method as defined by claim 1 wherein said semiconductor is monocrystalline silicon.

3. A method as defined by claim 2 wherein the etch-resistant mask layer is formed by thermal oxidation of the silicon surface.

4. A method as defined by claim 2 wherein a rectangular pattern is formed in said mask layer, all sides of which are aligned with a {331} plane located in a <310> direction, and wherein the etch pattern thereby produced has well-defined corners.

5. A method as defined by claim 4 wherein the orientation-dependent etchant comprises potassium hydroxide, n-propanol and water.

6. A method for the selective, preferential etching of a cubic semiconductor crystal surface having {100} orientation comprising:
- forming an etch resistant mask layer on said surface;
- patterning said mask layer to provide an aperture therein having at least one side aligned with the intersection of said surface with a {113} plane located in a <310> direction; and
- subjecting the masked surface to an orientation-dependent etchant.

7. A method as defined by claim 6 wherein said semiconductor is silicon.

8. A method as defined by claim 7 wherein said etch resistant mask layer is formed by thermal oxidation of said surface.

9. A method as defined by claim 7 wherein said mask layer is patterned to provide apertures having both sides aligned with a {113} plane located in a <310> direction, and wherein the etch pattern thereby produced has well-defined corners.

10. A method as defined by claim 7 wherein the orientation-dependent etchant comprises potassium hydroxide, n-propanol and water.

References Cited

UNITED STATES PATENTS

| | | | |
|---|---|---|---|
| 3,447,235 | 6/1969 | Rosvold et al. ------- | 148—174 |
| 3,423,651 | 1/1969 | Legat et al. --------- | 29—580 |

OTHER REFERENCES

Stoller: "Etching of Deep Vertical Walled Patterns in Silicon, RCA Review, June 1970, pp. 271–275.

Lee: "Anisotropic Etching of Silicon, Jour. of Applied Physics, October 1969, pp. 4569–4574.

(Other references on following page)

Finne et al.: A Water Amine Complexing Agent for Etching Silicon, Jour. Electrochem. Soc., September 1967, pp. 965–970.

Runyon: Semiconductor Technology. July 6, 1965, p. 89.

Beam and Gleim; "Influence of Crystal Orientation on Silicon Semiconductor Processing," Proc. of the IEEE, vol. 57, No. 9, September 1969, pp. 1469–1476.

Mendelson: "Stacking Fault Nucleation in Epitaxial Silicon on varioulу Oriented Silicon Substrates, Jour. of Applied Physics, vol. 35, No. 5, May 1964 pp., 1570–1581.

ROBERT F. BURNETT, Primary Examiner
R. J. ROCHE, Assistant Examiner

U.S. Cl. X.R.

317—235 F, AS, AJ; 148—1.5, 175; 156—7